United States Patent
Higgins

(10) Patent No.: US 12,191,818 B2
(45) Date of Patent: Jan. 7, 2025

(54) MUSICAL INSTRUMENT PREAMPLIFIER

(71) Applicant: Paul R. Higgins, Eden Prairie, MN (US)

(72) Inventor: Paul R. Higgins, Eden Prairie, MN (US)

( * ) Notice: Subject to any disclaimer, the term of this patent is extended or adjusted under 35 U.S.C. 154(b) by 175 days.

(21) Appl. No.: 17/932,827

(22) Filed: Sep. 16, 2022

(65) Prior Publication Data

US 2023/0089860 A1    Mar. 23, 2023

Related U.S. Application Data

(60) Provisional application No. 63/245,229, filed on Sep. 17, 2021.

(51) Int. Cl.
*H03F 3/18*    (2006.01)
*H03F 3/185*   (2006.01)

(52) U.S. Cl.
CPC ....... *H03F 3/1855* (2013.01); *H03F 2200/03* (2013.01); *H03F 2200/387* (2013.01); *H03F 2200/66* (2013.01)

(58) Field of Classification Search
CPC ............................ H03F 3/1855; H03F 2200/03
See application file for complete search history.

(56) References Cited

U.S. PATENT DOCUMENTS

| | | | | |
|---|---|---|---|---|
| 4,722,006 A * | 1/1988 | Kimura | ..................... | H04N 5/18 348/E5.071 |
| 5,131,046 A * | 7/1992 | Killion | ..................... | H03G 9/18 330/254 |
| 5,517,143 A * | 5/1996 | Gross | ..................... | G05F 3/265 330/288 |
| 6,175,277 B1 * | 1/2001 | Mavencamp | ........... | H03F 3/303 330/264 |
| 2005/0140610 A1 * | 6/2005 | Smith | ................. | G09G 3/3216 345/77 |
| 2009/0115528 A1 * | 5/2009 | Wang | ................. | H03F 3/45085 330/293 |
| 2015/0256941 A1 * | 9/2015 | Bymaster | ............... | H04R 25/30 381/323 |
| 2021/0191439 A1 * | 6/2021 | Hu | ......................... | G05F 1/575 |

* cited by examiner

*Primary Examiner* — Patricia T Nguyen
(74) *Attorney, Agent, or Firm* — Merchant & Gould P.C.

(57) ABSTRACT

A musical instrument preamplifier includes a n-type JFET and a pnp current mirror connected to the drain side of the JFET. The pnp current mirror includes two pnp transistors. The current mirror is configured to control the current to independently set the operating point of the JFET and the output. An npn transistor is connected to one of the pnp transistors of the current mirror to form an inverted Sziklai pair. An auto-bias network is connected between the npn and pnp transistors that form the Sziklai pair.

12 Claims, 11 Drawing Sheets

MUSICAL INSTRUMENT PREAMPLIFIER

CROSS-REFERENCE TO RELATED APPLICATIONS

This application claims the benefit of U.S. Provisional Application No. 63/245,229, filed Sep. 17, 2022, the disclosure of which is hereby incorporated herein by reference.

BACKGROUND

An on-board preamp, or "head amp", can be a useful addition to a musical instrument such as a guitar, bass, etc. A preamp can be used as a volume boost or overdrive for solo purposes, but if used at lower gain settings (e.g. unity or 0 dB), a preamp provides the advantages of active pickups (low output impedance, long cable driving ability) in an instrument fitted with otherwise passive circuitry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
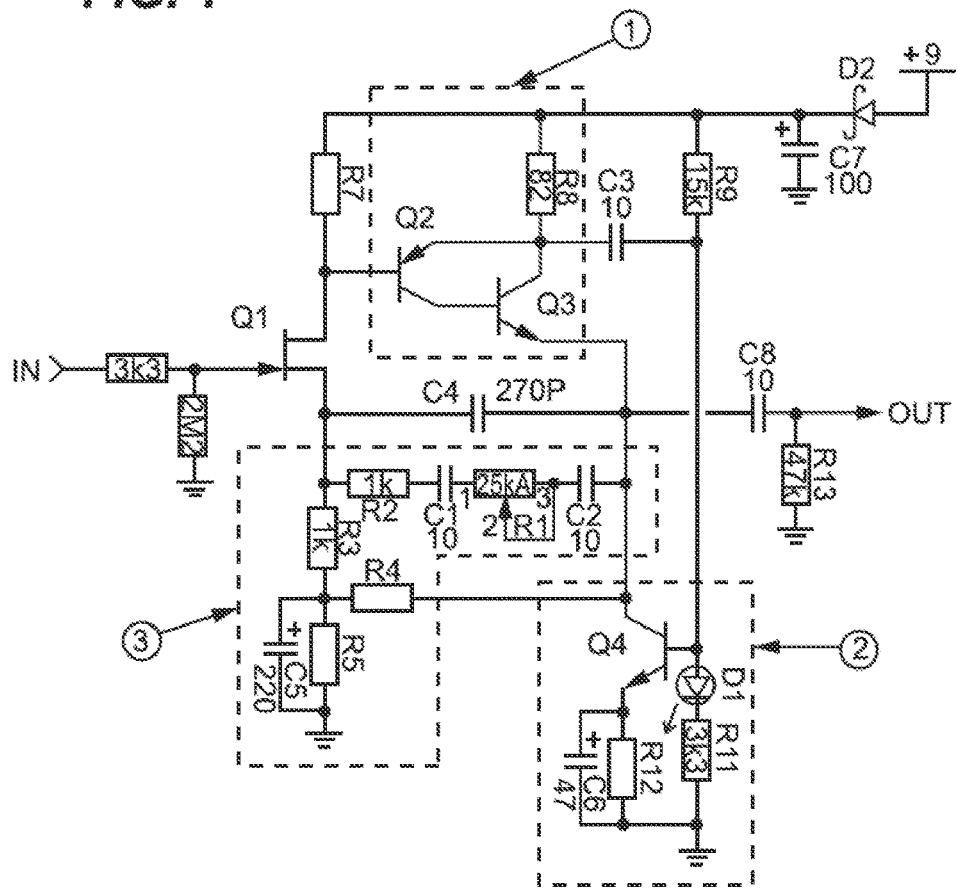
FIG. 1 is a schematic diagram illustrating aspects of an example circuit in accordance with the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A preamp can be used with musical instruments as a volume boost or overdrive. If used at lower gain settings (e.g. unity or 0 dB), a preamp provides the advantages of active pickups (low output impedance, long cable driving ability) in an instrument fitted with otherwise passive circuitry. However, an on-board preamp has several non-trivial engineering challenges to overcome, such as input impedance and signal-to-noise ratio.

Musical instrument pickups usually require a very high input impedance due to their inductive nature. This can be accomplished in several ways. Discussed embodiments include a junction field-effect transistor (JFET), which can be loosely described as a solid-state cousin of the vacuum tube. JFETs are known for their very high impedance and excellent noise specifications.

Even higher impedances can be created through AC-coupled "bootstrap" techniques, and these ultra-high impedances are sometimes required (e.g. piezo pickups). However, as impedances increase, so does circuit noise. A DC-coupled input is preferred for this application (magnetic pickups). A high impedance is required for today's overwound (high-inductance) humbucking pickups, while DC coupling is helpful in keeping circuit noise to a minimum. This is because noise is proportional to the DC resistance in the circuit, which in this case is the resistance of the pickup in parallel with the input resistance. If the pickup is DC-coupled (and the resistance of a typical "power pickup" such as the DiMarzio X2N™ is approximately 20 KΩ) then one can have the attractive combination of low input resistance with simultaneous high input impedance. For the rare cases where AC coupling is needed, a jumper option on the circuit board can be provided. But in nearly all cases, DC coupling will provide the highest performance.

Overall, the circuits described here address the goal of a high-impedance and extremely low noise preamp, which is small enough to be mounted inside a musical instrument. All unnecessary parts have been eliminated for several reasons. First, some of the parts used (the JFET and other transistors) are not currently available in the tiny surface-mount (SMD) form that allow for the highest degree of circuit miniaturization. However, these older parts are also currently unequaled in performance by the newer SMD parts. It is therefore necessary to keep the parts count low in order to keep the circuits small. There is a second reason for circuit simplicity: in most integrated circuit ("chip") amplifiers, the signal passes through 20-30 transistors between input and output. This is entirely unnecessary if the application is a simple audio preamp, and in fact it degrades the signal.

The circuits described here include discrete amplifiers (no integrated circuits in the signal path); the signal only passes through four or five transistors, for example, depending on which version of the circuit is used. Simple class-A circuits like these are ideal for low-level audio such as magnetic pickups. It should be emphasized that low-level audio is the most vulnerable of all signals when it comes to noise and distortion. At the same time, the amplifier circuits shown here are deceptively simple; they have extraordinarily high performance for their simplicity.

Some disclosed examples include a musical instrument low-level pre-preamplifier, sometimes called a "head amp." Head amps are typically contained inside the item they amplify. Such circuits are often used to convert low-level signals such as microphones and magnetic (musical instrument) pickups into higher-level signals. A head amp usually also transforms a high impedance signal source into a much lower impedance which can drive long cable runs and low impedance professional audio equipment without degradation. The head amp design presented here has several features which may be unique. To the best of the inventor's knowledge, there has not been a published circuit with all of the features of the one disclosed here.

FIG. 1 is a schematic diagram illustrating aspects of an example circuit in accordance with the present disclosure. The circuit of FIG. 1 includes the following aspects.

(1) Q2-Q3, an inverted Sziklai (compound PNP-NPN) pair, which serves as an active load/constant current source (CCS) for Q1, a 2N3819 JFET, as well as an emitter-follower output drive stage. Normally, Q2 would be terminated in a load resistor to ground, but it was discovered that connecting it directly to Q3 in Sziklai fashion resulted in better DC performance. This determines the maximum linear signal swing available from the circuit. The head amp typically runs from a single 9 V battery, which may limit signal headroom. By using this direct connection of Q2-Q3, the Q3 emitter voltage may be set at half the Q3 collector voltage, maximizing linearity and headroom. Certain examples thus terminate an inverted Sziklai pair with the combination of a CCS (Q4) and a "stacked" bias circuit (3).

(2) Q4 is a second CCS, serving as a current sink for Q2-Q3. Such a CCS is common practice, except for the fact, mentioned in (1), that Q2-Q3 are also driving a stacked bias circuit which separates AC signal voltages from the DC bias voltage, explained in (3). Q4 and associated components are arranged so that the current through Sziklai pair Q2-Q3 is approximately twice what would normally be drawn. This has three functions. First, the additional current drawn through Q4 and the stacked bias circuit properly biases Q1. Second, it is relatively trivial to adjust the bias circuit and current through Q4 in order to set the DC voltage at the Q3 emitter, as mentioned in (1). Third, the current through Q2-Q3-Q4 and the bias network determines the minimum impedance circuit the head amp can drive. Approximately 3.5-4 mA is needed to drive a low-impedance circuit such as a mixing desk input with an instrument-level signal. While this amplifier was primarily designed to drive a long cable connected to a high-impedance instrument amplifier or a mid-impedance (10 KΩ) direct box, it can be shown that the FIG. 1 circuit will drive a 600Ω input to a respectable (0 dBm) level when running at the appropriate current.

Also, to be noted is the red LED (D1) in place of the conventional diode as the temperature-compensating element of CCS Q4. Substituting an LED allows proper CCS biasing to a supply voltage of 4.5 V, significantly below the 5 V figure which most manufacturers consider to be an exhausted 9V battery. While other aspects of the circuit (headroom, output impedance) may degrade as the battery discharges, the circuit is designed to remain functional during adverse conditions.

(3) is the stacked feedback/bias circuit, which consists of separate AC and DC paths. (See also FIG. 8 and FIG. 10). It was inspired by old vacuum-tube circuits which use a somewhat related approach to provide AC (signal) feedback. The version here is inverted from a tube circuit and uses different parts values. In particular, the very stiff RC rolloff at the AC ground (R4-R5-05) ensures that no signal is present at this node.

The AC and DC paths are both driven by Q2-Q3-Q4. The DC path is through R4-R5-C5, with C5 establishing an AC ground, which eliminates any signal contribution in this circuit. The AC path is through C2-R1-C1-R2, with C1 and C2 blocking any DC through this circuit. Because C5 establishes an AC ground, the gain of the head amp is determined by the ratio (R1+R2)/R3. R5 is shorted out by C5 for AC signals.

It should be noted that the feedback/bias "stack" is common to all designs disclosed here. Also, to be noted in FIG. 1 is R3, which is common to both AC and DC paths for Q1. In so doing, R3 provides additional local negative feedback to Q1. In the other circuits, this topology is the same: FIG. 4 (R3), FIG. 7 (R13), and all others except FIGS. 2-3 (from TI AN-32).

Figure 2:
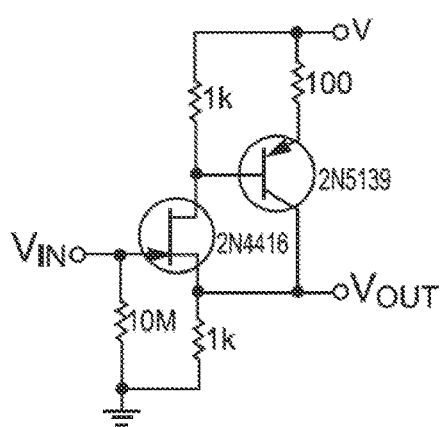
FIG. 2 is a schematic diagram illustrating aspects of an example buffer circuit in accordance with the present disclosure.
Figure 3:
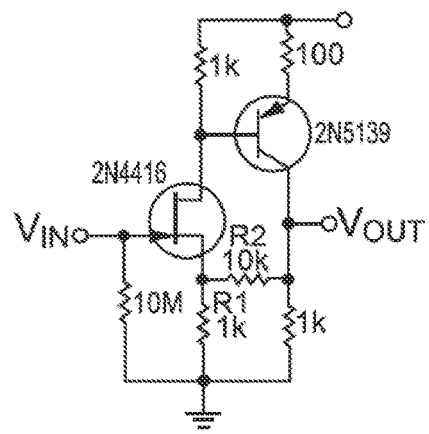
FIG. 3 is a schematic diagram illustrating aspects of an example amplifier circuit in accordance with present disclosure.
Figure 4:
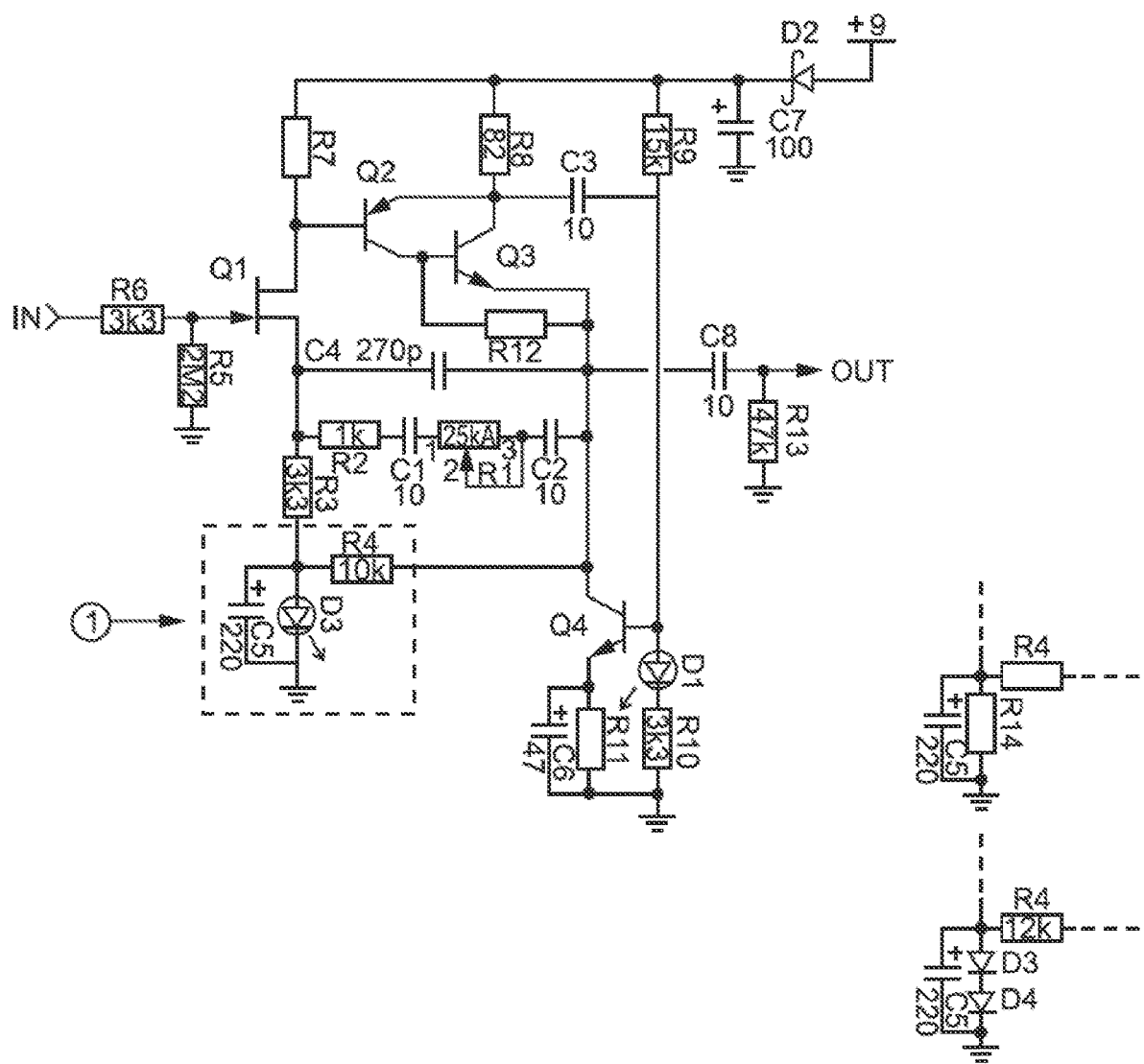
FIG. 4 is a schematic diagram illustrating aspects of a variation of the circuit illustrated in FIG. 1.

The rationale behind separating the AC and DC circuit paths has to do with the nature of the head amp design (see FIGS. 2-3). The basic circuit is a JFET-PNP transistor compound pair, described as a "video amplifier", but which has also seen use as a guitar preamp/impedance converter and as a buffer/integrator in an analog synthesizer VCF. The circuit is a wideband, low-noise, high-performance amplifier, so its use in analog video circuits is natural. However, it has one major drawback: the DC bias and AC (signal) gain are based on the same resistor ratio.

FIG. 2 is a schematic diagram illustrating a high impedance, low capacitance wideband buffer circuit. The circuit of FIG. 2 employs a JFET (e.g. 2N4416 JFET) receiving an input signal. The JFET has a low input capacitance, which makes the illustrated compound-series feedback buffer a wideband unity gain amplifier. FIG. 3 illustrates a high impedance, low capacitance amplifier circuit. The illustrated compound-series circuit provides high input impedance and a stable, wideband gain.

First, the resistor ratio needs to be set for the most linear operation of the circuit, particularly the JFET, which as a square-law device is not especially linear. (This is less of an issue for the buffer version of FIG. 2, which has only one resistor to set operation). Second, changing the gain of the circuit implies the use of a potentiometer (variable resistor), which in the AN-32 circuit will have a DC bias on it. This has been shown to be detrimental to audio quality; a gain control with a DC bias will be scratchy-sounding due to imperfections in the resistance track of the potentiometer. This is made much worse in musical instrument applications by both the enormous (often >60 dB) gain of instrument amplifiers, and the fact that the amplification is frequently nonlinear (i.e. using dynamic compression or distortion). Any low-level noise will be greatly amplified, while the signal itself will be limited by either clipping or compression. This is a worst-case scenario for circuit noise of any kind.

A variable resistance with an isolated control element, such as a photoresistor-LED optocoupler, often going by the trade names "Vactrol" or "Audiohm", can be used here. However, the problem remains that by changing the feedback resistance in the AN-32 circuit, one is also changing the DC operating point, and therefore linearity and headroom. The optocoupler may solve the noise problem by replacing a potentiometer, but the other problems remain. And there is an additional problem: as the battery discharges, the optocoupler resistance increases because the LED in the package grows dimmer with falling battery voltage. This causes amplifier gain to increase for a given control setting; circuit gain eventually becomes fixed at a high level resulting in distortion.

To separate the AC signal, C1 and C2 block any DC, while at 10 µF still allowing proper low-frequency response. A variable gain control (R1) is now possible without any DC noise "scratches". Proper biasing of the JFET and output current drive are also easily adjusted via the DC path. Varying R3, R4, and R5 does not significantly affect AC gain (R1 and R2 can always be adjusted to balance changes in R3, while R4 and R5 are at AC ground and do not affect gain). Changes in output drive from CCS Q4 also have no effect on gain. As mentioned in (1), current through Q4 and the bias circuit also determines the operating point of Q2-Q3 and the maximum signal swing.

There is one further benefit to the FIG. 1 circuit, which led the inventor to create a commercial design around it. By adding two tie-down resistors to ground from C1 and C2, gain control R1 can be shorted out with a switch, converting the circuit into a buffer (gain=0 dB). The tie-downs prevent loud "thump" transients due to DC bias on C1 and C2. This allows the circuit to be easily switched from a buffer to a preamp. If installed inside a musical instrument such as an electric guitar or bass, R1 can be wired to a "push-pull pot" having a pull-actuated switch. This allows for a sudden gain boost (e.g. for solos) by pulling up (switch open) on the control, simply and noiselessly. When pushed in (switch closed), the control is shorted and has no effect.

Figure 5:
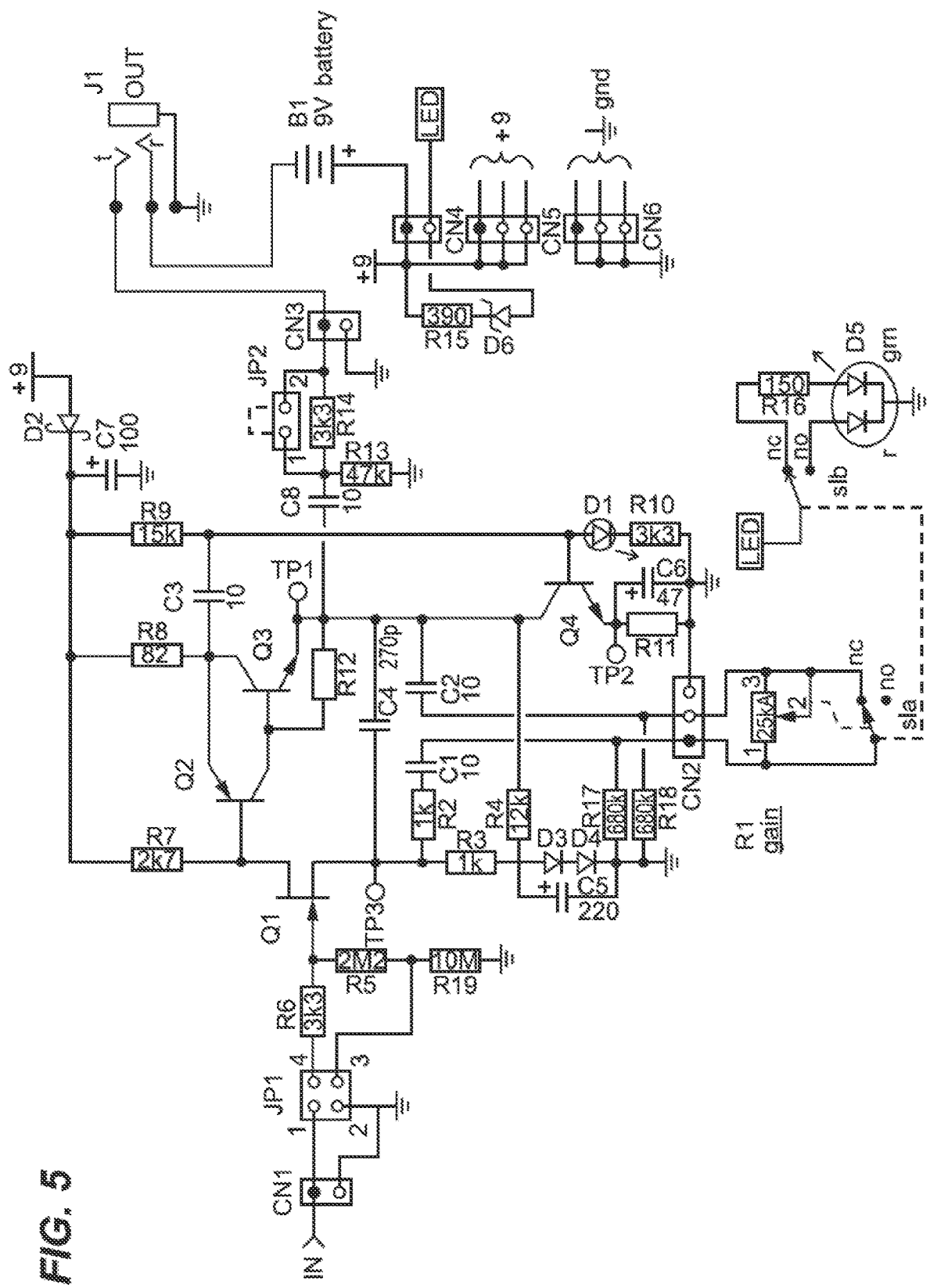
FIG. 5 is a schematic diagram illustrating aspects of a further example circuit in accordance with the present disclosure.

FIG. 5 is a circuit diagram, including the tie-downs (R17-R18) and buffer/preamp switching. (Note that it is based on the revised FIG. 4 circuit). Additional circuitry is primarily various jumpering schemes to set input/output impedance and AC/DC input coupling. PCB connectors are also shown, and the unused terminals on the push-pull pot DPDT switch are used for a two-color LED indicator (which with the addition of Zener diode D6 doubles as a "dead battery" light).

Figure 6:
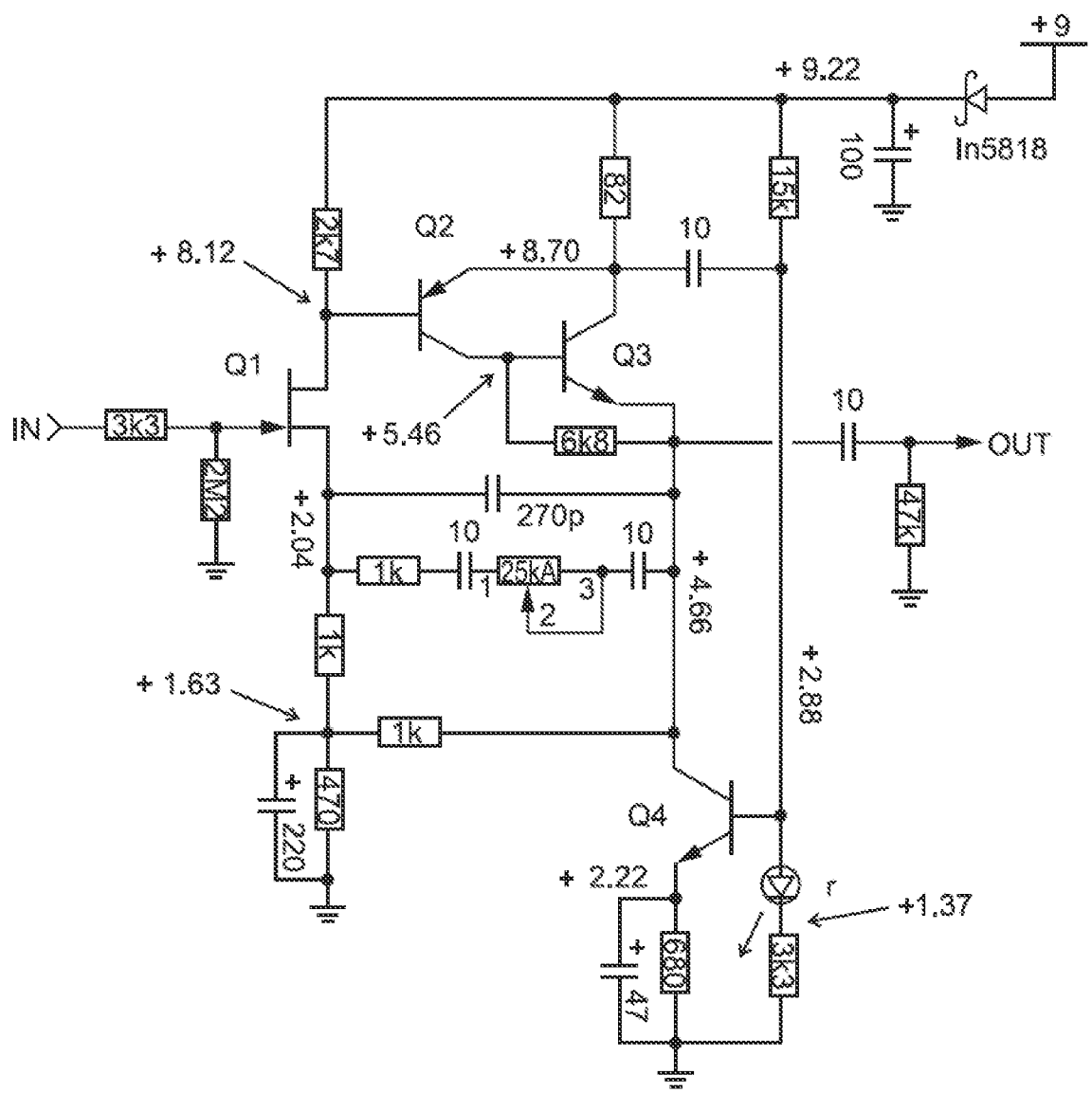
FIG. 6 is a schematic diagram illustrating aspects of a variation of the circuit illustrated in FIG. 4.

FIG. 6 shows a revised FIG. 4 circuit, with example voltages noted.

Another example is shown in FIG. 4. This differs from the circuit of FIG. 1 by one part, R12. In this case, Q2-Q3 are still connected as an inverted Sziklai pair; however, the Q2 collector is now connected to the Q3 emitter through R12. It was discovered that in the FIG. 1 circuit, Q1 had to be selected from many different 2N3819s in order to find one that would work. R12 provides some pull-down current for Q3 so that Q2 runs at higher current. This provides more stable circuit operation and guarantees maximum compound beta from the Sziklai pair. R12 also provides better biasing for Q3, which means the DC feedback voltage to Q1 through the feedback/bias stack is in the proper range. With the addition of R12, more 2N3819s than not will work.

As in FIG. 1, FIG. 4 denotes an aspect of the schematic with a circled number, shown here in parentheses. (1) shows how part of the feedback/bias stack may be modified to properly bias Q1. See also FIG. 7 for further examples.

Many biasing options are possible: LEDs typically have a Vf=1.3-1.8 V. Two 1N4148 diodes in series have a Vf=1.2 V. Lower voltages are possible using dissimilar diodes, e.g. 1N4148 (silicon) and 1N5818 (Schottky) in series are about 0.9 V. A pair of resistors is also possible, as in R4-R14. Note that any of these variations (and others) can be used in the bias stack of all circuits shown.

While the addition of R12 (FIG. 4) is a simple revision over FIG. 1, a selection from several 2N3819s was required to find one which would work in the circuit. This is one of the disadvantages of the original design which made commercial applications problematic. The revised circuit in FIG. 7, while having a superficial appearance quite different to the original (FIG. 1), retains its functionality while improving circuit performance. This circuit was arrived at by experimentation with the original and revised (FIG. 4) circuits.

Figure 7:
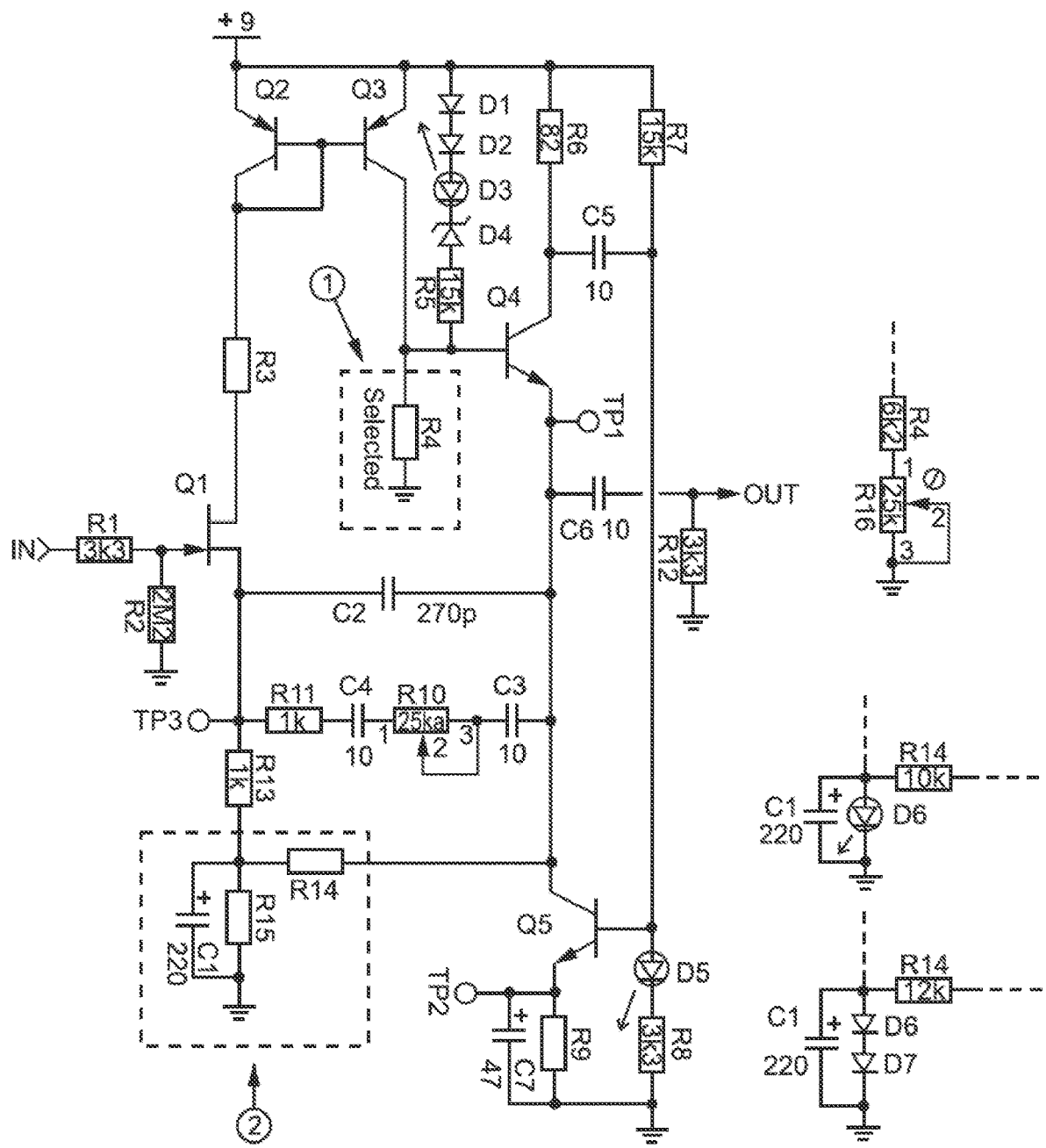
FIG. 7 is a schematic diagram illustrating aspects of a further variation of the circuit shown in FIG. 4.

In FIG. 7, the constant current source (CCS) found in FIGS. 1, 4 (Q2) has been replaced with current mirror Q2-3. In so doing, the proper operating point for the output driver (Q4-Q5) can be set independently of the operating conditions of CCS Q2 and JFET Q1 by mirroring current to Q3 which can then be set to a different voltage range. This makes proper biasing much easier, usually only requiring the adjustment of one resistor, R4. There is typically some variation in biasing of Sziklai pair Q3-Q4 (Note that Q3 doubles as half of the current mirror, and Q4 doubles as half of the output driver. The other half of the output driver is Q5) because there is so much variation in JFETs (Typically the crucial Vgs(off) and Idss parameters have a 10:1 or greater variation). This is an unavoidable aspect of JFETs which has unfortunately prevented their wider use in audio, particularly in simple class-A circuits like these. By using a current mirror to separate the interacting parts of FIG. 1 and FIG. 4, such problems are largely eliminated. With this change, selection of 2N3819s is only occasionally required.

The example shown in FIG. 7 also allows for the use of the network D1-D4/R5. This "auto-bias" circuit was created to allow simple class-A circuits to be used at different supply voltages without having to change multiple part values. The addition of this network is a further bonus of the current mirror design. However, once the auto-bias circuit was added, an unexpected improvement to the circuit was noted.

The clipping behavior of FIG. 7 is asymmetric (without auto-bias network D1-D4/R5), typical of this kind of circuit, and similar to simple class-A vacuum-tube designs of the past. Flattening of the negative-going signal, creating a somewhat full-wave-rectified waveform, is typical of the triode circuits in tube amplifiers, and the Q1 circuit is the JFET equivalent of a triode amplifier. Note that the current mirror allows JFET Q1 to "free run" (open loop). It is a current mirror rather than the usual current source. This preserves the triode-amplifier nature of this JFET circuit, which is nearly identical to a vacuum-tube circuit. The current mirror ensures that the currents through R3/Q1 and R4 are equal while allowing a voltage level shift. While this has a certain charm as part of the "tube sound", the illustrated example provides as linear a circuit as possible. It was found that when the auto-bias network was added, not only did FIG. 7 bias properly and automatically for voltages between 5-20 V, but also the clipping behavior was greatly improved. Clipping reappeared only at significantly higher signal levels and is now symmetrical so that headroom is maximized.

This secondary action of the auto-bias circuit slightly reduces overall gain while increasing headroom and linearity at signal levels near clipping. This strongly suggests that the auto-bias circuit dynamically shifts the operating point of Q3-Q4, and it appears to linearize the circuit at high signal levels. In so doing, it behaves somewhat like a Gilbert multiplier, which linearizes a signal through pre-distortion which precisely cancels the distortion of a subsequent amplifier stage.

The illustrated auto-bias circuit includes a mixed string of diodes (Germanium, LED, and Zener), which provides an unusual transfer function as the network begins to conduct. One can think of the auto-bias circuit as a dynamic, non-linear voltage divider. Germanium diodes D1-D2, LED D3, and R5 form the dynamic voltage divider which works against R4 to set a varying bias dependent on signal level and supply voltage.

Zener diode D4 provides a "baseline" voltage which should be approximately the difference between the desired bias point and the voltage drop across D1-D3. In other words, D4 adds whatever additional voltage drop is needed to reach an approximate bias point. D4 must be a low-power Zener (400-500 mW) due to the low currents; otherwise, it may not conduct. D1-D2 are Germanium small-signal diodes like 1N34 or 1N60. Typically, D3 is a red LED (Vf=1.6 V) and D4 is commonly between 2.0-2.8 V. Once the correct values for the network are determined, they can be used for all production applications of FIG. 7 so long as one uses the same semiconductor manufacturer. Using a trimpot, as shown in FIG. 7 (R16), makes this procedure much easier by allowing fine adjustment of the bias voltage on Q4. The circuit is most sensitive to variations in JFET (Q1) characteristics.

Figure 9:
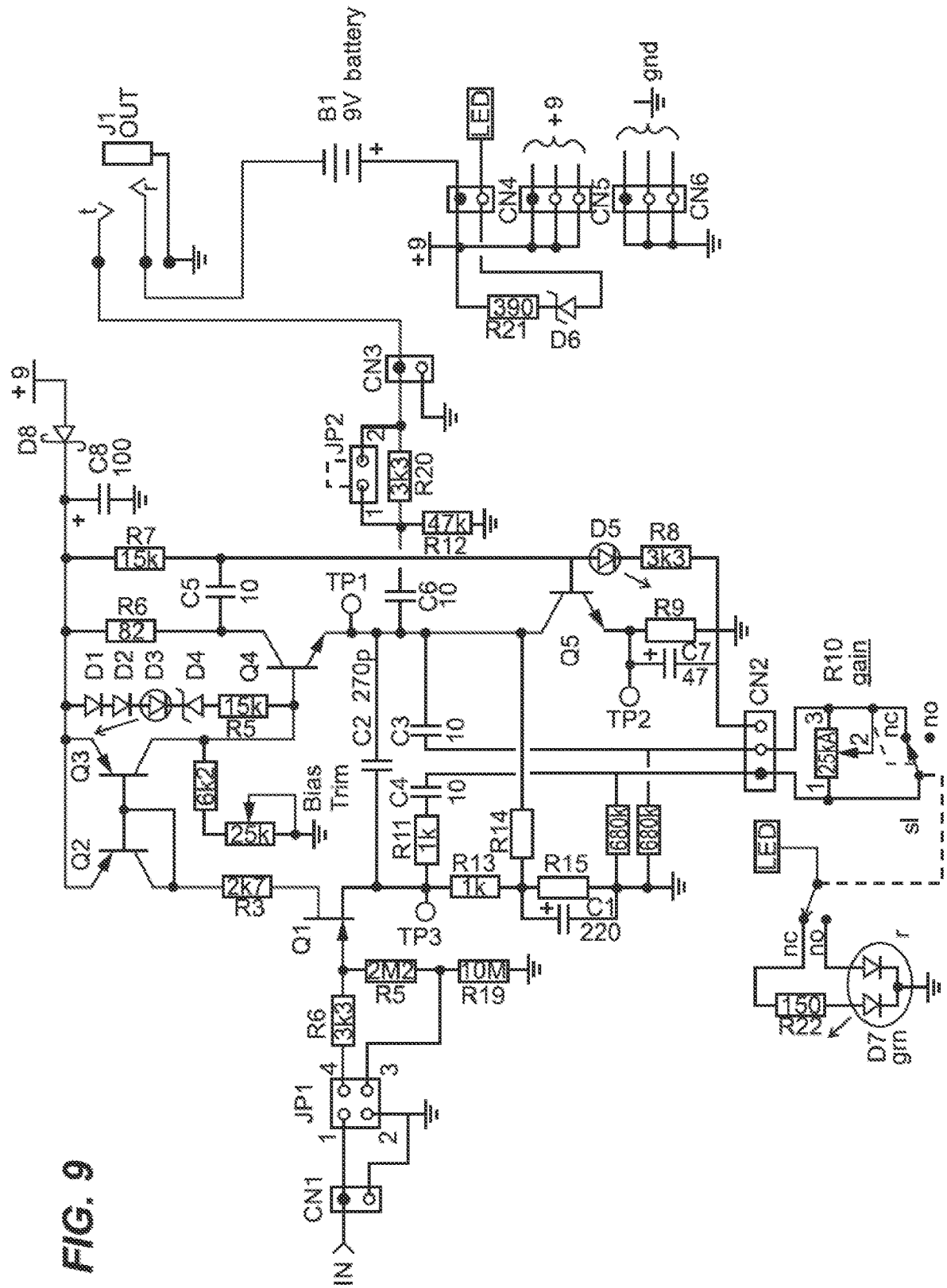
FIG. 9 is a schematic diagram illustrating aspects of a variation of the circuit shown in FIG. 5.
Figure 12:
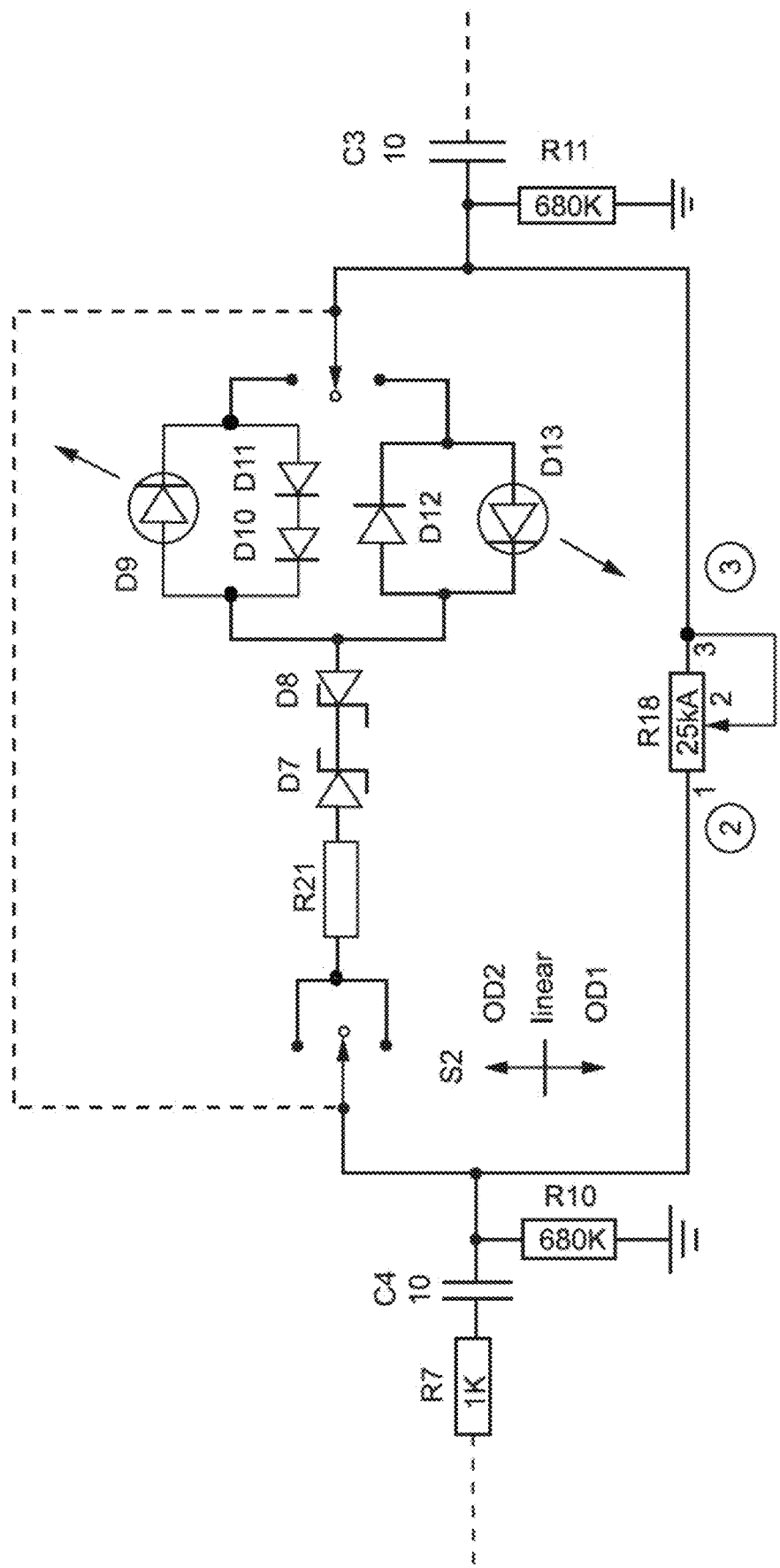
FIG. 12 is a schematic diagram illustrating aspects of a variation of the circuit shown in FIGS. 7-9.

Other combinations of diodes are within the scope of this disclosure; and are not limited to the examples shown in FIG. 7, FIG. 9, and the related clipper circuit of FIG. 12.

The auto-bias network was designed with a unique transfer function which is exponential in the 4.3-4.8 V region and then becomes linear. D1-D3 function to create the exponential curve, which relies on the properties of Germanium diodes and LEDs. D4 determines when the network will be cut off by adding additional voltage drop; it does so because of the abruptly-conducting nature of Zeners.

This unique shape is arrived at through careful selection of the diode string D1-D4. Because of D4, the auto-bias circuit is nearly cut off under normal, non-clipping, small-signal conditions. However, when the signal voltage (or supply voltage) rises, additional current is injected by R5 into the node at R4 and the base of Q4. The exponential shape is rather gentle as D1-D2 begin to conduct, accelerating as D3 fully conducts. At this point, the transfer function becomes linear, as it is only dependent on R5. Germanium diodes and LEDs are known for a gradual, current-dependent forward voltage (Vf), which is exploited in the auto-bias circuit. This gradual Vf is well-known to engineers working in audio and music technology fields. It is often exploited in such applications as soft-clipping circuits.

In some examples, the auto-bias circuit is adjusted by allowing it to always provide a very slight bias current starting at around 4.5 V or just below (e.g. half the supply voltage). A signal of 4.5 Vpeak is the point at which clipping will occur. In reality, clipping begins somewhat earlier, especially without the auto-bias; the asymmetric "flattening" of the signal has already been noted. The circuit works by way of adding in a small current to that provided by R4. It is generally adjusted so that the value of R4 results in Q4 being slightly underbiased. However, with the current added through the auto-bias network, a proper operating point is achieved (about 4.5 V at TP1, FIG. 7). A small current is always passing through the auto-bias network, but it is nearly cut off. Bias is most easily adjusted by adding a trimpot, as shown in FIG. 7 (See (1) in FIG. 7, "bias circuit").

Figure 8:
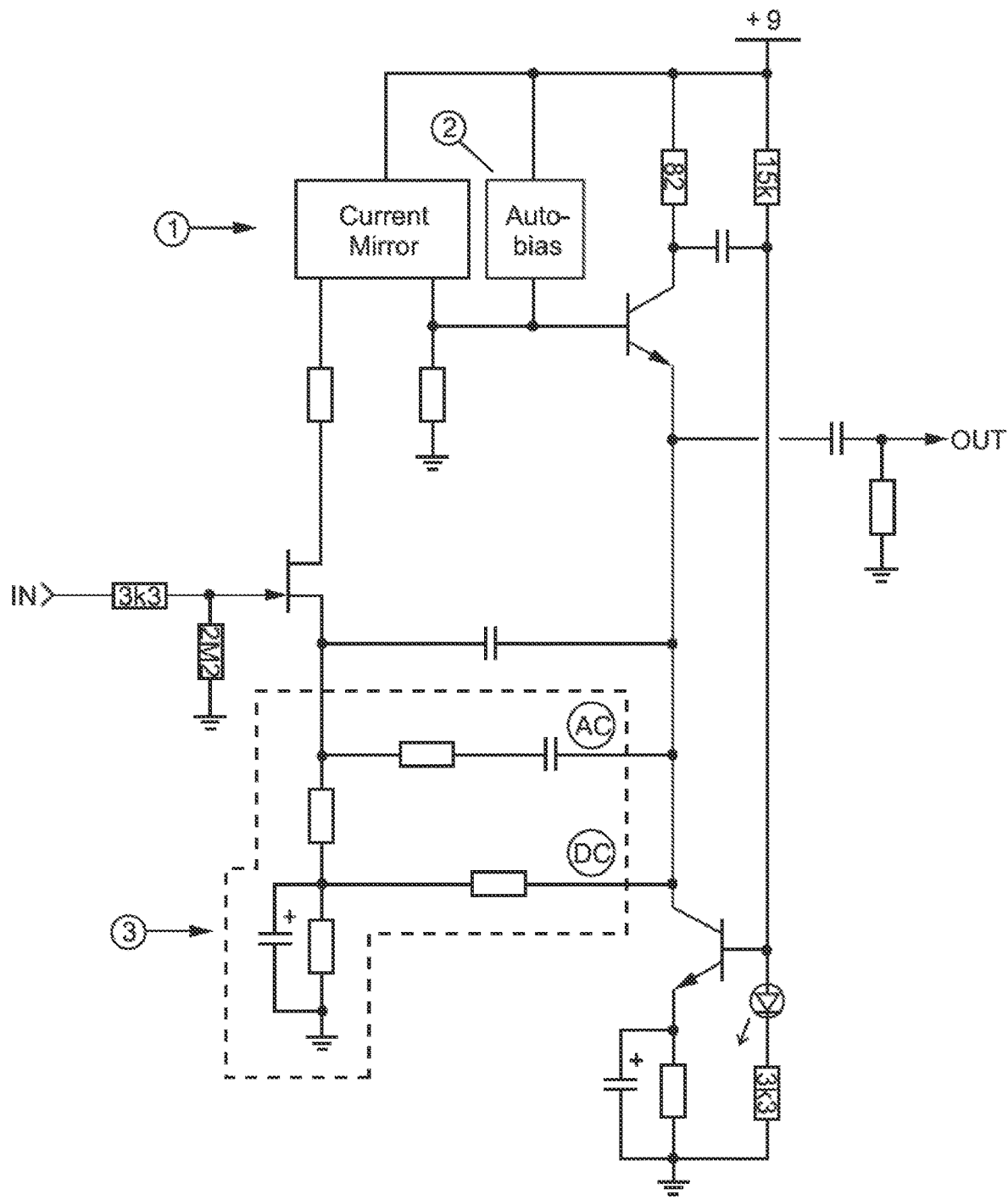
FIG. 8 is a schematic diagram illustrating aspects of a simplified version of the example circuits disclosed herein.

FIG. 8 is a simplified version of the circuit showing the aspects of the design. The AC and DC paths through the feedback/bias "stack" are clearly shown in simplified form. Also note that R13 in FIG. 7 (R3 in FIG. 1) functions as local negative feedback for Q1 while also being part of the bias stack, and that all transistors run at constant current. All of these are reasons for the high performance of the circuits described.

FIG. 9 is a another example circuit similar to that shown in FIG. 5. The schematic of FIG. 9 shows various jumper options for impedance, circuit board connectors, and other details.

Some examples, such as those shown in FIGS. 4-11 operate satisfactorily at a range of voltage between 5V and 18V. Additionally, the embodiments shown can still work as desired beyond even 20V. However, one with skill in the art will recognize that through simple modification, other values outside the range or not listed can work just as well.

The circuits shown have extraordinarily high performance for their low-voltage and low-current nature, running off a 9 V battery (a highly non-ideal power source). Once greater voltages become available, particularly bipolar supplies, more traditional operational amplifier (opamp) designs become more attractive. The engineering challenge here is the significant practical limitation of fitting a circuit and power source into a small space (musical instrument) while still providing professional-grade sound.

Figure 10:
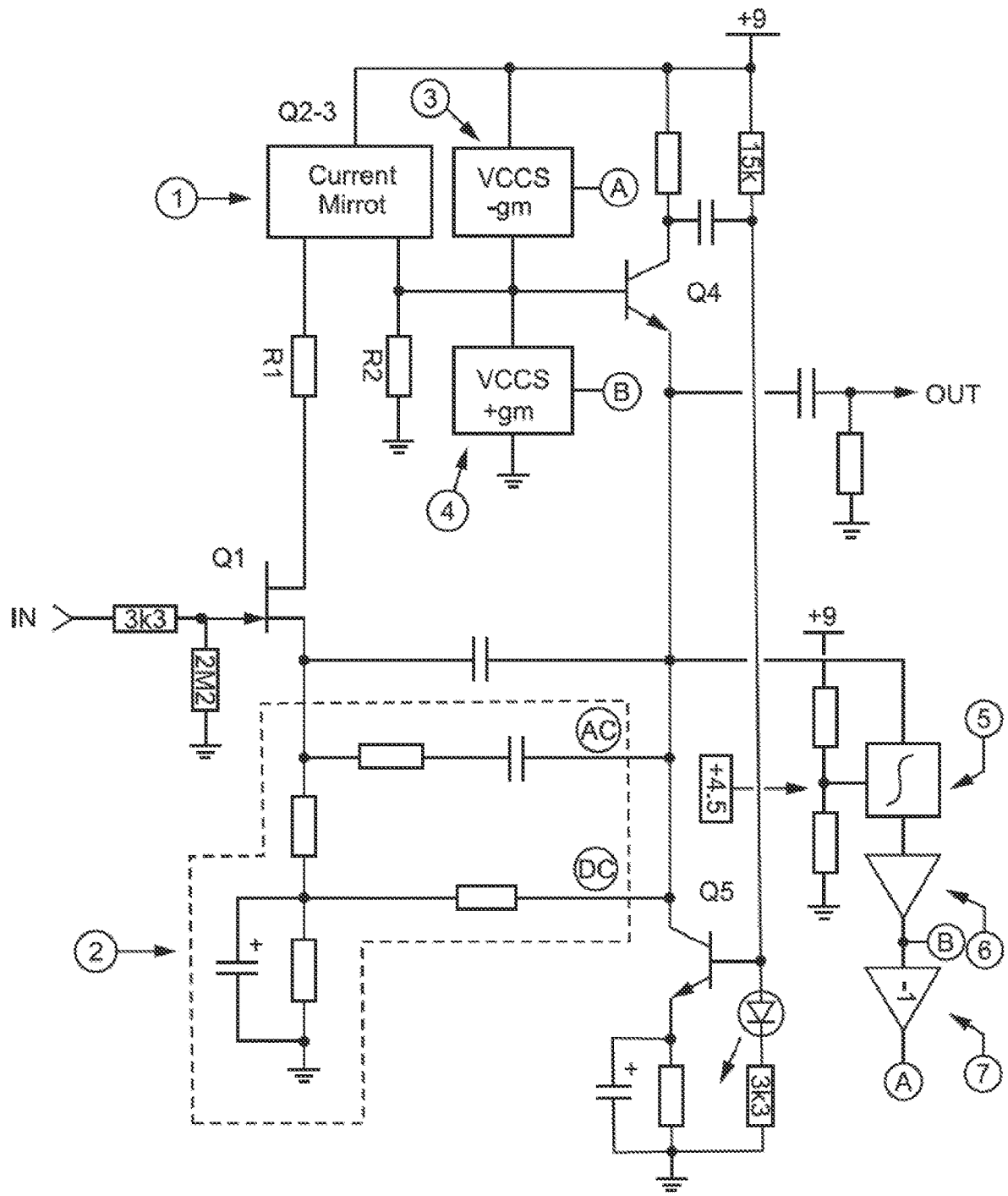
FIG. 10 is a schematic diagram illustrating aspects of a circuit in accordance with further embodiments.
Figure 11:
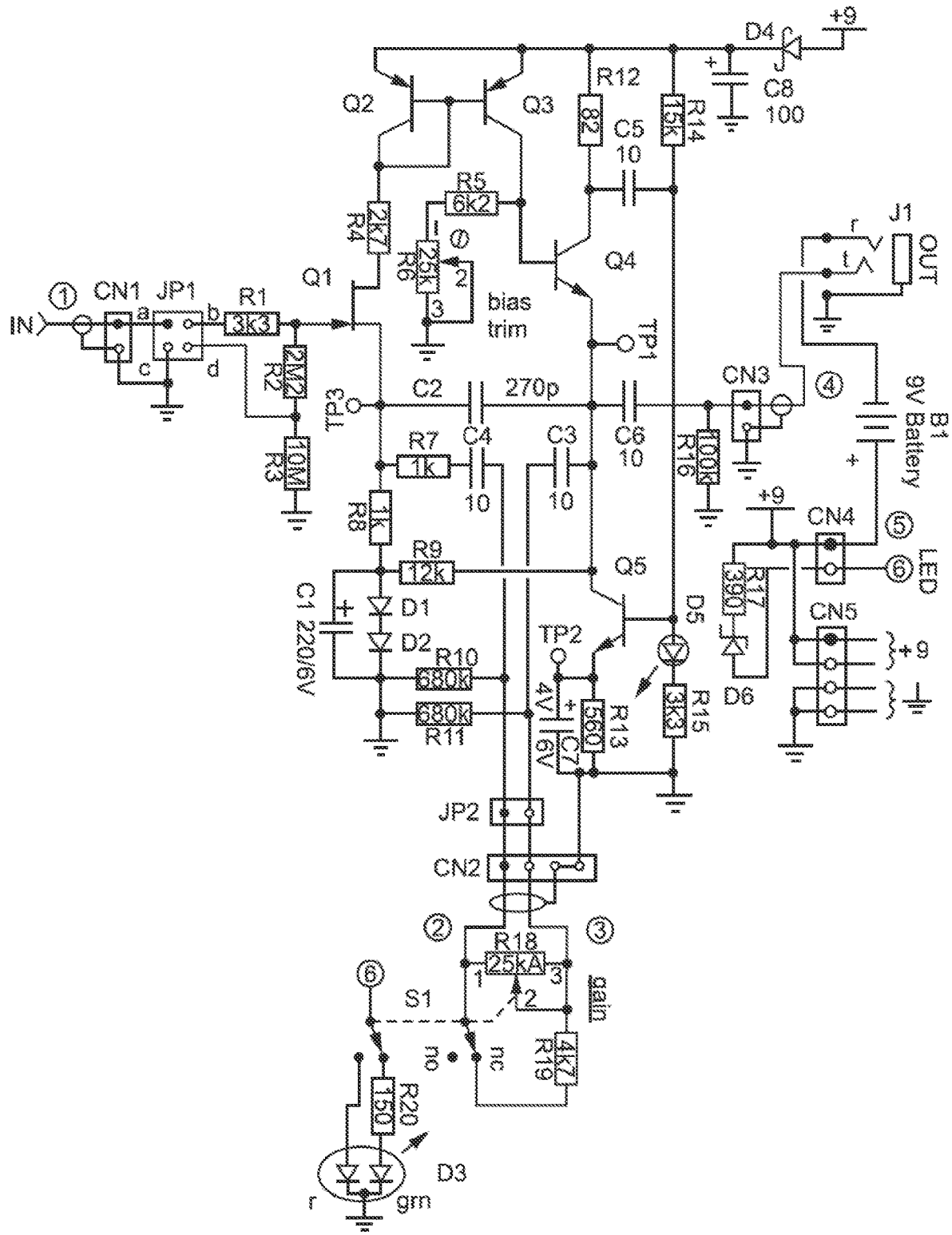
FIG. 11 is a schematic diagram illustrating aspects of a simplified version of the circuit shown in FIG. 9.

Further embodiments are illustrated in FIGS. 10-12. In the circuit of FIG. 9, the bias point is trimmed using R16, and the nonlinear diode network (D1-D4, R5) may be adjusted when a new batch or manufacturer of JFETs is used. In FIG. 10, further aspects are depicted in block diagram form. As with the other schematics, circled numbers are depicted here in parentheses.

(1) As in the previous designs, Q2-Q3 are a current mirror that acts as a level shifter and second-stage amplifier (as before, Q3 also functions as an inverted Sziklai pair with Q4). (2) is likewise unchanged, the stacked bias/feedback network with separate AC and DC paths. (3) and (4) are new modifications which include of either a voltage-controlled current source or current sink (VCCS), respectively. Both embodiments are discussed and are not to be read as limiting of the present invention, merely embodiments that are shown.

In the illustrated example, the VCCS is essentially a transconductor, hence the gm symbol. The transistors in the design—particularly JFET Q1—are nonlinear, devising a biasing circuit which is fixed in nature (even the nonlinear circuit disclosed in FIGS. 7-9) can only be an approximation as conditions change (especially as battery voltage drops). Therefore, a simple active (self-adjusting) VCCS keeps the output stage (Q4-Q5) properly biased at half-supply-voltage. This provides maximum linearity and headroom even as battery voltage drops over time.

A possible VCCS candidate is a p-JFET current source, as these can be controlled with positive voltage rather than the negative voltage an n-JFET requires. The p-JFET can be linearized with feedback or can be left open-loop as the servo will compensate for nonlinearity. The JFET behaves as a voltage-controlled resistor (transconductor). Either of the VCCS devices is controlled by voltages (A) or (B), which correspond to the servo circuitry, to be discussed next.

(5)-(7) comprise a simplified block diagram of the VCCS integrator/servo circuitry. (5) is an integrator which samples the DC voltage superimposed on the output signal. This voltage corresponds to the operating point of the output stage. For maximum linearity and headroom, this voltage should be approximately 4.5 V (i.e. half supply voltage). The integrator averages the DC operating point over a certain amount of time in order to reject any AC (signal) voltage on the output. Generally, such an integrator should have a time constant equal or greater than the reciprocal (period) of f/10, where f is the lowest frequency the circuit should reproduce. The inventor takes a conservative approach and sets this time constant ≥5-10 s, as this is both much slower than any signal transient and much faster than changes in supply voltage.

The output of the integrator is compared with a half-supply-voltage reference (About +4.5 V with a fresh 9 V battery; because this voltage is derived from a resistor divider, it will track the battery voltage as it changes) and a proportional error voltage is derived at the output of the servo amplifier (6) which drives the VCCS sink (4). If one desires to use a VCCS source (3) instead, the servo is inverted by (7) to produce an opposite control voltage. Note that in a single-supply circuit, inversion of servo (6) is accomplished by subtracting the input to inverter (7) by a reference voltage so that an oppositely proportional positive voltage is produced (since no negative voltage is available). In other words, the positive voltage output of (7) has an opposite trend to servo (6), so that as the output of (6) increases, the output of (7) decreases and vice versa.

The distinction between +gm and −gm in FIG. 10 can be understood by considering what happens when the operating point of the output stage changes. If the operating point goes more positive, then the voltage to integrator (5) increases. The output of the integrator likewise increases. which causes a positive shift in the output (B) of servo (6). Since VCCS (3) is a p-JFET (or similar in action) current source, a positive-going gate voltage decreases additional current injected into the base of Q4 (see also R4 and R5 in FIG. 7). By Ohm's Law, lower current into this node means the voltage on the base of Q4 will fall, maintaining output voltage at +4.5 V. This action corresponds to a negative transconductance (−gm). Similarly, if one chooses to use VCCS (4), a current sink, then as the operating point of output stage Q4-Q5 goes more positive, the output of integrator (5) and servo (6) increase; this control voltage is then inverted (7) so that servo control voltage (A) decreases proportionally. Like current source (3), current sink (4) is a p-JFET (or similar in action), so as its control voltage decreases, transconductance increases (and so its resistance decreases). Now since this node (R2, VCCS, base of Q4) is driven by a current mirror, the current at this node cannot increase (it is fixed at exactly the current through R1). Instead, the decrease in resistance of VCCS (4) means that the voltage at this node will fall (by Ohm's Law), maintaining the operating point at 4.5 V. This action corresponds to a positive transconductance (+gm).

Some disclosed examples use a dual/quad opamp and a JFET as integrator; this provides simplicity and a very small circuit size. The opamp requires high impedance, low offset, and low power consumption (e.g. LF444-series). This servo bias scheme also meets the goal that integrated circuits are kept out of the signal path and the circuit remains a discrete transistor class-A design.

FIG. 11 depicts a simplified version of the FIG. 9 circuit. The nonlinear diode network has been omitted, and several connectors have been consolidated. These changes allow further miniaturization of the circuit for use in the most space-constrained applications. Careful biasing of JFET Q1 minimizes performance degradation near dead-battery supply levels. Using a fixed-bias reference (D1-D2) in series with the Q1 source resistor (R8) maintains performance down to supply voltages where other parts of the circuit could begin to fail.

FIG. 12 is a circuit using a diode network optimized for intentional soft-clipping of an audio signal, to be used as an option in the AC feedback loop using switch S2. This is a variation on the network disclosed in FIGS. 7-9 which was discovered to be useful for soft-clipping.

As before, circled numbers in the schematic are depicted here in parentheses. The parts call-outs in FIG. 12 are a continuation of those in FIG. 11 (i.e. in FIG. 12 resistors begin with R21, diodes begin with D7, etc.), and the FIG. 12 circuit should be viewed as an add-on modification to FIG. 11. (2) and (3) which are part of the gain-determining (AC) feedback loop make clear how this modification fits into the FIG. 11 circuit. The soft clipper circuit shown is essentially in parallel with gain control R18.

When modifying various audio electronics devices, many of which have intentional generators of harmonic distortion, it was noted that when listening to the distortion produced by various soft-clipping circuits—particularly those using Germanium diodes such as the 1N34/1N60—it was often difficult to hear obvious clipping unless a musical interval (e.g. fifth) was played so that intermodulation products could be heard. Sometimes even under these conditions, the clipping has such low-order distortion products that it manifests only in harmonics like the octave and double octave which do not sound like obvious distortion. These low-order harmonics serve to reinforce the fundamental pitch and are typically audible as distortion products only at high levels.

Unlike FIGS. 7-9, the FIG. 12 version of the diode network has elements which are in anti-parallel, as the circuit is now not providing DC current; rather, an audio clipper must pass an AC signal. (Zener diodes D7-D8 are not anti-parallel as they pass AC in series). In a similar way to FIGS. 7-9, the series Zener diodes D7-D8 in FIG. 12 act to set a level threshold, in this case the onset of clipping. Unless the peak signal voltage exceeds the Zener voltage (plus the Vf sum of other diodes in the circuit), the network does not conduct. The Zener threshold voltage is set relatively low, typically ≤2 V. This allows some headroom for linear amplification before clipping begins.

The approach in the FIG. 12 circuit uses a multiplicity of diodes as nonlinear circuit elements. It is often but not always the case that non-identical diodes are used (e.g. 1N34, 1N4001) and connected in anti-parallel. In addition, R21 is a limiting or "compliance" resistor (explained in the next paragraph). It should be noted that variations are possible; the circuit disclosed in FIG. 12 is relatively simple, with nonlinear elements (D9-D13) sharing common circuitry (R21 and D7-D8). This is so the same approximate signal level is maintained in the OD1 and OD2 (overdrive) modes using switch S2. Other applications may require more complex versions of this circuit which share little or no common circuitry.

R21 acts to reduce voltage gain when conductance begins in the diode network, as it is then in parallel with gain control R18. R21 also acts as part of the soft-clipping action by this gain reduction; if R21 is omitted, the diode network acts as a clamp circuit which leads to much harder clipping and higher-order harmonics. In this way, R21 adds a linear element to an otherwise nonlinear (clamp) circuit. The function of R21 has been described as a "compliance resistor", providing additional headroom for soft-clipping before the hard-clipping clamp action commences.

Figure 13:
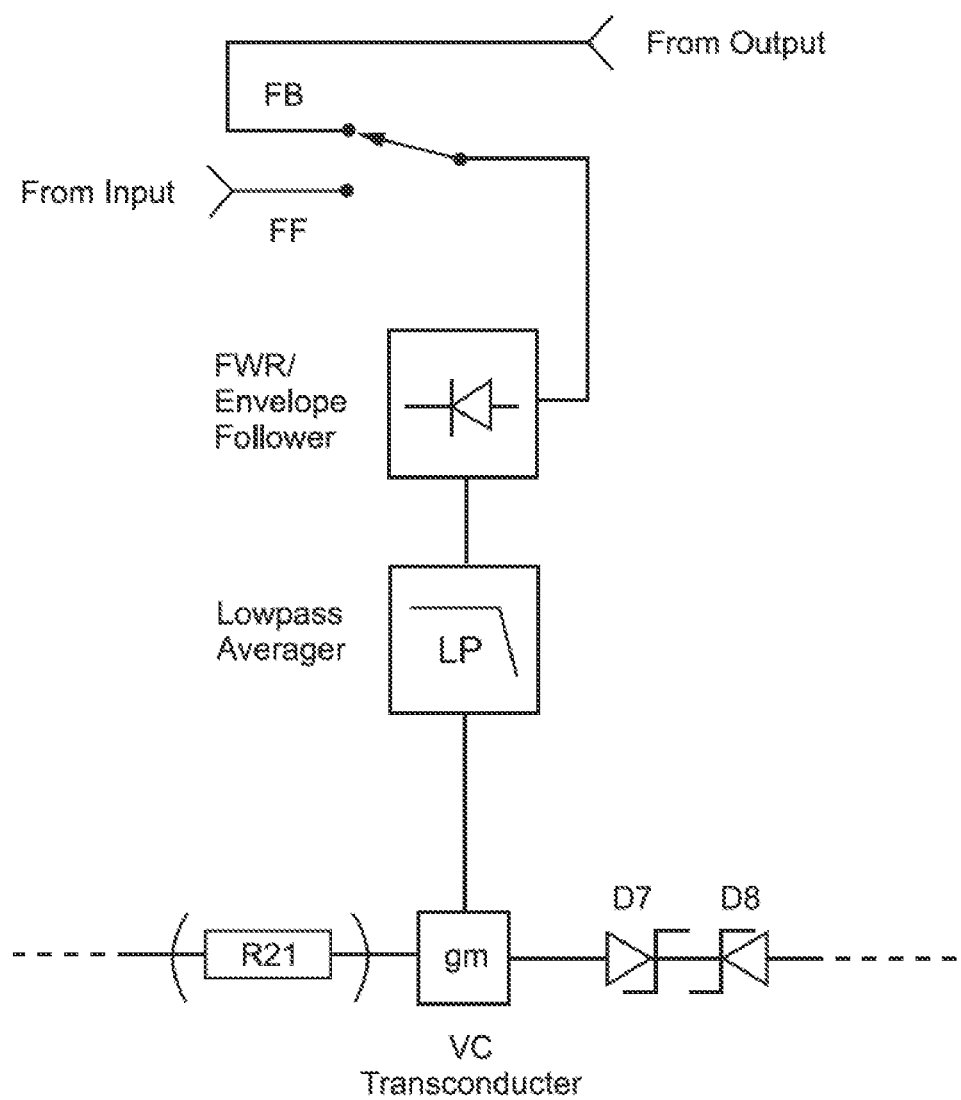
FIG. 13 is a block diagram illustrating aspects of a transconductor in accordance with aspects of the present disclosure.

In some examples, R21 may be replaced or augmented with a voltage-controlled transconductor (e.g. resistive optocoupler such as Vactrol™ and Audiohm™, which include a lightproof enclosure containing an LED/photoresistor combination). In the specific case of an optocoupler, the LED light source is driven by an envelope follower (e.g. rectifier followed by lowpass filter/averager) which tracks its input level. In so doing, the resistance of the photoresistor can be made to increase/decrease with input level, changing the behavior of the clipping circuit and the composition of the harmonics generated. The envelope follower can tap the signal from either the input (feedforward) or output (feedback) of the preamp. A block diagram of a proposed design is shown in FIG. 13. Note that other voltage-controlled transconductors can be used (e.g. THAT2181 VCA), and the implementation here does not limit the scope of the invention.

A brief explanation is warranted about the multiplicity of diodes used in FIG. 12. The purpose of Zener diodes D7-8 has been previously explained. The embodiment also uses four different diode types to accomplish the desired soft-clipping: 1N34 Germanium, 1N4001 Silicon rectifier, and two LEDs (red and green). These all have differing forward voltages and conductance characteristics which are exploited in creating asymmetric clipping. Example Vf for the diodes: 1N34=0.25 V, 1N4001=0.6 V, red LED=1.4 V, green LED=1.8 V. These diode types exhibit gradual conductance which generally results in a clipped waveform with rounded corners.

LEDs and particularly Germanium diodes produce the softest clipping in the bench tests. Silicon rectifiers clip somewhat harder but still exhibit gradual conductance. Rectifier diodes and LEDs have significant capacitance which often results in rolloff of the highest frequency harmonics. By comparison, Silicon small-signal diodes like the 1N4148 have low capacitance and very fast conduction, leading to objectionable high-order harmonics. Other diode types are also being used in experimental circuits: bicolor LEDs (antiparallel two-color), blue LEDs (Vf≅3 V, useful for larger signals), Schottky rectifiers (Vf≅0.25 V, substitute for 1N34), diode-connected transistors, and diode-connected FETs (in particular, high-capacitance power MOSFETs).

The trend for clipping in diodes, from softest to hardest, is generally Ge<LED<Si rectifier<Si small-signal. As noted, rectifiers like the 1N4001 tend to have higher capacitance and softer clipping than small-signal diodes; Schottky rectifiers like the 1N5818 are preferred over the BAT41 type (Schottky small signal) for the same reason. Red and green LEDs are favored for their particularly soft clipping compared with other LED types. And while Silicon rectifiers are not as ideal as Germanium diodes or LEDs for soft-clipping, they are still useful for some applications. In general, the combination of LEDs, Germanium diodes, and Silicon rectifiers depicted in FIG. 12 is probably the most versatile approach for creating various clipping sounds.

In some examples, LEDs are used in a clipping circuit where anti-parallel red LEDs are used in a multiband clipper. However, all things being equal, using identical anti-parallel LEDs results in clipping that is too symmetrical and lacking in the euphonic even-order harmonics that predominate in asymmetric clipping. This kind of clipping may be found in vacuum-tube, JFET, and MOSFET circuitry, especially in the simple class-A designs found in classic studio equipment and instrument amplifiers. Some examples use "free-run" (no feedback) clipping networks. In the case where a clipper is used in a feedback loop, as in some disclosed examples, the use of a compliance resistor in the loop will suppress the most objectionable hard-clipping. Some designs use LEDs in a simple clamp circuit which often results in harsh-sounding clipping. This is somewhat mitigated by the gradual "soft" conduction of LEDs, but nonetheless, the generally hard-clipping nature of this design is one of its flaws.

Approximate waveforms are shown in FIG. 12. In the first example (OD1), the positive half of a sine wave at the input is flattened and rounded by 1N34 diodes, similar to overdriven triode and FET circuits. By comparison, the negative half of the waveform is clipped somewhat harder by a red LED, although it still retains rounded edges. This type of clipping does not look, or sound distorted; such rounded, flattened waveforms are characteristic of soft clipping. Higher-order harmonics are suppressed, and so the clipping action is much less audible: it becomes a tone "color" rather than obvious "hard" distortion.

In the second example (OD2), the positive half of the waveform is now smaller than the negative half. However, absolute signal level remains approximately the same. Because harder-clipping diodes are used (1N4001, green LED), the distortion generated will have higher-order harmonics. However, the diodes selected will still produce a relatively soft-clipped waveform while providing a useful tone color option.

The main aim of the circuits disclosed in FIGS. 12-13 is the creation of highly asymmetrical clipping. As has been explained throughout the disclosures of the various circuits (FIGS. 1-13), triode (and FET) circuitry—particularly the simple class-A circuits found in classic audio technology—is known for its euphonic nature characterized by asymmetric soft-clipping. Assuming a sine-wave input signal, this type of circuitry produces a somewhat full-wave-rectified output when overdriven. Such overdriven signals often do not sound objectively distorted, at least not until the overdriving input signal becomes very large and the clipping becomes quite extreme. Under more moderate conditions, this soft-clipping creates a more powerful and "solid" sound, primarily through the creation of even-order harmonics and a cycle-by-cycle signal compression which is quite different from the dynamic range compression often used in audio technology.

The circuits disclosed in FIGS. 11-13 are not designed as a hard-clipping "distortion box", but rather as a sort of "character" circuit which adds some welcome low-order harmonic coloration when the preamp circuit is used as a direct box (e.g. plugging an instrument directly into a mixing desk without any coloration from an amplifier/speaker). A DPDT three-position center-off switch enables the clipping circuit to be disengaged at will, allowing purely linear amplification when desired.

Disclosed embodiments thus provide a preamplifier circuit where, as shown in the example of FIG. 1, include a connection of a Sziklai pair (PNP-NPN) that is inverted from a usual Sziklai connection. The pair Q2-3 is connected to JFET Q1 in place of the conventional PNP transistor seen often as a second stage (e.g. in opamps). Furthermore, the Sziklai pair does double-duty in that the Q3 half (along with current sink Q4) acts as an enhanced emitter-follower output driver. Q4 provides current-sinking action for the active pull-down needed to drive low input impedances like mixing desks.

In accordance with further aspects, the use of the Sziklai pair in place of the typical second-stage PNP transistor is further developed into a current mirror design. For example, see Q3-4 in FIG. 7 and FIG. 9. Q3 is now part of a current mirror and level-shifting stage which makes the design more practical as noted herein above. Here the current mirror does double-duty: Q3 is one half of a current mirror (with Q2), while it also acts as one half of a Sziklai pair with Q4. (Q5 is the active pull-down). This provides a simple, compact, extremely high-performance audio preamplifier which can be powered from a 9 volt battery (a highly non-ideal power source). Such a design (see, e.g., FIG. 11) facilitates its placement inside constrained spaces like musical instruments and requires this kind of economy in parts use.

Moreover, disclosed examples include a "stacked" series-parallel feedback loop, which serves to separate AC and DC paths. Among other things, this feedback loop allows independent setting of DC bias and AC gain.

Examples such as that illustrated in FIG. 12 provides a nonlinear (clipping) circuit using a multiplicity of asymmetrical (non-identical) diodes. Zener diodes D7-8, serve to enforce a signal level threshold below which the clipping circuit is effectively out of the circuit, since a region of linear amplification is desirable before clipping commences. FIG. 13 discloses how this clipping circuit can be made to track signal dynamics by using a rectifier (envelope follower) and lowpass filter/averager/RMS converter to control a transconductance element. The dynamics-tracking circuit can be connected to the input (feedforward) or output (feedback) signals.

In accordance with still further disclosed aspects, the use of either the Sziklai pair as a current source (FIGS. 1, 4-6) or in a current mirror (FIGS. 7-11) allows the circuit to be designed as a simple class-A JFET preamplifier while also optimizing the circuit (especially the output driver) for maximum headroom and linearity. Note that the standard source and drain resistors are present, similar to a class-A circuit using JFET or bipolar transistors. The canonical opamp circuit usually dispenses with these resistors and replaces them with constant-current sources. Disclosed examples instead create a hybrid circuit that has some opamp qualities, such as enforcement of circuit conditions using current sources and DC feedback/biasing, while keeping the simple resistor-capacitor-coupled nature of discrete class-A circuits.

The example shown in FIG. 10 provides a method using an integrator/servo circuit to create an automatic biasing circuit for the output driver (Q4-5). This allows for ideal operation of the output driver under all circuit conditions and is superior to the simple resistor approach of, for example, FIG. 7 (R4).

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device for pre-amplifying musical instrument signals comprising:
    an n-type JFET;
    a pnp current mirror connected to a drain side of the JFET, the pnp current mirror including first and second pnp transistors, wherein the current mirror is configured to control current to independently set an operating point and an output of the JFET;
    an npn transistor connected to the first pnp transistor of the current mirror to form an inverted Sziklai pair; and
    an auto-bias network connected between the npn and pnp transistors that form the Sziklai pair, wherein the auto-bias network comprises a voltage-controlled current source.

2. The device of claim 1, wherein the auto-bias network includes at least one diode.

3. The device of claim 2, wherein the auto-bias network includes a Zener diode.

4. The device of claim 1, wherein the auto-bias network comprises a current sink.

5. The device of claim 1, wherein the voltage-controlled current source comprises a servo circuit.

6. A device for pre-amplifying musical instrument signals comprising:
    an n-type JFET;
    a pnp current mirror connected to a drain side of the JFET, the pnp current mirror including a first pnp transistor and a second pnp transistor, the first pnp transistor having a base terminal connected to a base terminal of the second pnp transistor, the second pnp transistor having a collector terminal and its base terminal connected to the drain side of the JFET, wherein the current mirror is configured to control current to independently set an operating point and an output of the JFET;
    an npn transistor having a base terminal connected to a collector terminal of the first pnp transistor of the current mirror to form an inverted Sziklai pair; and
    an auto-bias network connected between the npn transistor and the first pnp transistor that form the Sziklai pair.

7. The device of claim 6, wherein an emitter terminal of the first pnp transistor is connected to an emitter terminal of the second pnp transistor.

8. The device of claim 7, wherein the emitter terminal of the first pnp transistor and the emitter terminal of the second pnp transistor are connected to a voltage input terminal.

9. The device of claim 6, further comprising a resistor connected between the collector terminal of the second pnp transistor and the drain side of the JFET.

10. The device of claim 6, further comprising an AC feedback loop including a diode network switchably connected between a signal input terminal and a signal output terminal and configured for soft-clipping of an audio signal.

11. The device of claim 10, wherein the diode network is configured for asymmetric soft-clipping of the audio signal.

12. The device of claim 10, wherein the diode network includes a plurality of different diode types.

* * * * *